United States Patent
Furukawa et al.

(10) Patent No.: US 6,272,509 B1
(45) Date of Patent: Aug. 7, 2001

(54) FILTER DEVICE

(75) Inventors: Hitonobu Furukawa, Osaka; Hideya Kitamura; Hirokazu Kitamura, both of Gifu; Tetsuya Fuke, Shiga; Atsushi Doi, Osaka, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/208,521

(22) Filed: Dec. 9, 1998

(30) Foreign Application Priority Data

Dec. 12, 1997 (JP) .................................................. 9-342465
Dec. 18, 1997 (JP) .................................................. 9-348938

(51) Int. Cl.$^7$ ................................................ G06F 17/10
(52) U.S. Cl. ........................................................ 708/319
(58) Field of Search ...................................... 708/319, 316

(56) References Cited

U.S. PATENT DOCUMENTS

| | | | |
|---|---|---|---|
| 5,313,412 | * | 5/1994 | Nukui .................................... 708/319 |
| 5,369,606 | * | 11/1994 | Hessel ................................... 708/319 |
| 5,379,242 | * | 1/1995 | Rose et al. ............................. 708/319 |
| 5,487,089 | * | 1/1996 | Misaizu et al. ....................... 708/319 |
| 5,838,725 | * | 11/1998 | Gurusami et al. ................... 708/319 |
| 5,966,314 | * | 10/1999 | Lee ....................................... 708/319 |
| 6,138,132 | * | 10/2000 | Lee et al. ............................. 708/319 |

* cited by examiner

Primary Examiner—David H. Malzahn
(74) Attorney, Agent, or Firm—Rossi & Associates

(57) ABSTRACT

The invention relates to a filter device, and is intended to prevent drastic changes of output modulation signal and assures the performance as modulator if output modulation signal is transmitted and stopped frequency by using TDMA in communication control.

To achieve the object, the invention comprises a shift register 1, a plurality of memories 2 connected to this shift register 1 and increased in the bit width of input address by one bit each, and a selector 3 for selecting outputs from these plurality of memories 2, in which the output of the shift register 1 is used as a higher side address of each one of the memories 2, a lower side address of each one of the memory addresses is common, the bit width of the higher side address increases by one bit each starting from one bit, and addresses are assigned sequentially from the lower side of the higher side address of the memories 2 depending on the shift from the lowest side bit of the shift register 1.

5 Claims, 7 Drawing Sheets

FILTER DEVICE

FIELD OF THE INVENTION

The present invention relates to a filter device used in a modulator or the like in a transmitter.

BACKGROUND OF THE INVENTOION

Recently, in portable telephone, cable television, communication modem, etc., digital modulation is employed, and time division multiple access (hereinafter called TDMA) is widely used in communication control. As the modulator, a filter device is used for limiting the frequency band. In the filter device, a memory is often used for reducing the circuit size.

FIG. 6 shows a conventional filter device using a memory. Input signal data 100 is entered in an n-bit shift register 8. The output of the shift register 8 is used as a higher address of a memory 5. A signal generated in an address control circuit 4 is used in a lower address of the memory 5. The output of the memory 5 is converted into an analog signal by a digital to analog converter (hereinafter called D/A converter) 6.

Supposing n different impulse response waveforms corresponding to 1 or 0 of the data of each bit position of the shift register 8 to be generated, each bit of the shift register 8 combined with the waveform interference given to a specific bit position j ($1 \leq j \leq n$) is digitized. The information to be stored in the memory 5 is this digitized data, and it is converted into an analog signal by the D/A converter 6. The signal generated in an address control circuit 4 used in the lower address of the memory 5 is for over-sampling the analog output signal of the D/A converter 6 for a period of input of next data at time t+1, from the state of the shift register 8 at a certain time t.

When the output of the shift register 8 accesses the memory 5, the waveform interference of the impulse response waveform of each bit position on the specific bit position j can be issued, and the filter device characteristic can be designed by design of information stored in the memory 5.

Thus, the filter device can be composed in a circuit constitution using a memory.

FIG. 7 shows other prior art of filter device using a memory. Input signal data 100 is entered in an n-bit shift register 27. The output of the shift register 27 is used as a higher address of a memory 14. The signal generated in an address control circuit 18 is used in a lower address of the memory 14. The output of the memory 14 is converted into an analog signal by a D/A converter 17.

Each one of n different impulse response waveforms corresponding to 1 or 0 of the data of each bit position of the shift register 27 is digitized by combining with the waveform interference given to a specific bit position ($1 \leq j \leq n$). The information to be stored in the memory 14 is this digitized data, and it is converted into an analog signal by the D/A converter 17. The signal generated in an address control circuit 18 used in the lower address of the memory 14 is for over-sampling the analog output signal of the D/A converter 17 for a period of input of next data at time t+1, from the state of the shift register 27 at a certain time t.

By accessing the memory 14 by the output of the shift register 27, the waveform interference of the impulse response waveform of each bit position on the specific bit position j can be issued, and the filter characteristic can be designed by design of information stored in the memory 14.

Thus, in the circuit constitution using the memory 14, the circuit size can be reduced as compared with the circuit using a multiplier.

However, the TDMA is a method of transmission by repeating transmission and stop of output signals of the modulator in a burst manner. Accordingly, in the prior art as shown in FIG. 6, the output of the filter device is changed drastically by transmitting or stopping. As a result, numerous large-peak signals are generated in a wide frequency band, and a significant interference is caused on other channels remote in frequency, and many errors are generated. Therefore, in such prior art as shown in FIG. 6, the performance as the modulator cannot be guaranteed.

Or, in the case of the filter device as shown in FIG. 7, the circuit size is determined by the memory size, that is, the number of stages of the shift register 27. However, the number of stages of the shift register 27 determines the performance indices of the modulator such as the modulation precision, and it cannot be curtailed extremely. Downsizing of circuit is the most important design element for the filter device. However, in the prior art shown in FIG. 7, when the number of stages of the shift register 27 is curtailed, the performance of the modulator such as modulation precision deteriorates, and the performance as the modulator cannot be assured.

The invention is devise d in the light of the above problems, and it is hence an object thereof to remove the defects of the prior arts, and prevent drastic changes of output modulation signal and assure the performance as the modulator if transmission and stop of the output modulation signal are repeated frequently by using the TDMA in the communication control.

It is also an object of the invention to prevent deterioration of performance such as modulation precision and assure the performance as modulator if the circuit size is reduced by curtailing the number of stages of the shift register.

SUMMARY OF THE INVENTION

To achieve the objects, the invention comprises a shift register, a plurality of memories connected to this shift register and increased in the bit width of input address by one bit each, and a selector for selecting outputs from these plurality of memories, in which the shift register output is used as a higher side address of each one of the memories, a lower side address of each one of the memory addresses is common, the bit width of the higher side address increases by one bit each starting from one bit, and addresses are assigned sequentially from the lower side of the higher side address of the memories depending on the shift from the lowest side bit of the shift register.

The data entered in the filter device is put into the shift register. After the beginning data after start of transmission is shifted to the first bit of the shift register, the higher side address width of the memory selects the memory output of one bit. When the second data is put into the shift register and the beginning data is shifted to the second bit, the higher side address width of the memory selects the memory output of two bits. When the next data is put into the shift register and the beginning data is shifted to the third bit, the higher side address width of the memory selects the memory output of three bits. In this manner, the memory of address width corresponding to the bit position of the beginning data being shifted is selected successively.

At the bit position of the shift register corresponding to the higher side address of each memory, the impulse response corresponding to the data at each bit position is considered. Each bit combined with the waveform interference given to the position of a specific bit of the shift register is digitized (for example, if the higher side address width of the memory has three bits, it is considered that there is an impulse response waveform corresponding to the data at each position of the input side three bits of the shift register). The information to be stored in each memory is its digitized data.

The effect of impulse response of data of a certain bit position on the waveform interference given to other bit position becomes larger as coming closer to the bit position for issuing impulse response. By changing over the selection of memory output depending on the bit shift on the shift register of the beginning data, it is possible to control to increase gradually the degree of effect of the impulse response on the specific bit position.

In this way, by changing over the memory output depending on the beginning data position entered in the shift register, it is possible to control to increase gradually the degree of effect of the impulse response by each bit position data. Therefore, if the output signal of the modulator is suddenly changed over from stop state to transmission state, the output of the filter device is not changed drastically, and no serious interference is caused on other channels remote in frequency. Hence, the filter device guarantees the performance as the modulator.

Moreover, the invention comprises a shift register, an inverter for inverting the bits except for the highest bit of the output signal from this shift register from 1 to 0 or from 0 to 1, a first selector for selecting the bits except for the highest bit of this inverter output or the shift register output, a memory using the output of this first selector as the higher side input address, an operating circuit for operating this memory output, and a second selector for selecting and issuing either this operating circuit output or the memory output, in which when the highest bit of the shift register is 1, the first selector selects the inverter output and the second selector selects the operating circuit output, and when the highest bit of the shift register is 0, the first selector selects the shift register output and the second selector selects the memory output.

The signal entered in the filter device is put into the shift register. The inverter receives the shift register except for the highest bit, and inverts each bit. The first selector receives the shift register output except for the highest bit and the inverter output, selects the inverter when the highest bit of the shift register is 1 or the shift register if 0, and sends out to the memory. The memory uses the output of the first selector as the higher side memory address. The operating circuit executes the aliasing operation to the nearly central value of the dynamic range after D/A converter defined by the data information of the memory on the value read out from the memory. The second selector receives the memory output or operating circuit output, selects the operating circuit when the highest bit of the shift register is 1 and the memory if 0, and sends out to outside.

The highest bit value of the shift register is always 0, and each impulse response waveform corresponding to the data of each one of other bit positions combined with the waveform interference given to the specific bit position is digitized. The information to be stored in the memory. is its digitized data.

Thus, by using the highest bit of the shift register as the selection signal and operating the value read out from the memory, if the memory capacity is half that of using all bits of the shift register, the filter device prevents deterioration of performance such as precision of modulation, and assures the performance as the modulator.

DETAILED DESCRIPTION OF THE PREFERRED EMBODIMENTS (Embodiment 1)

Figure 1:
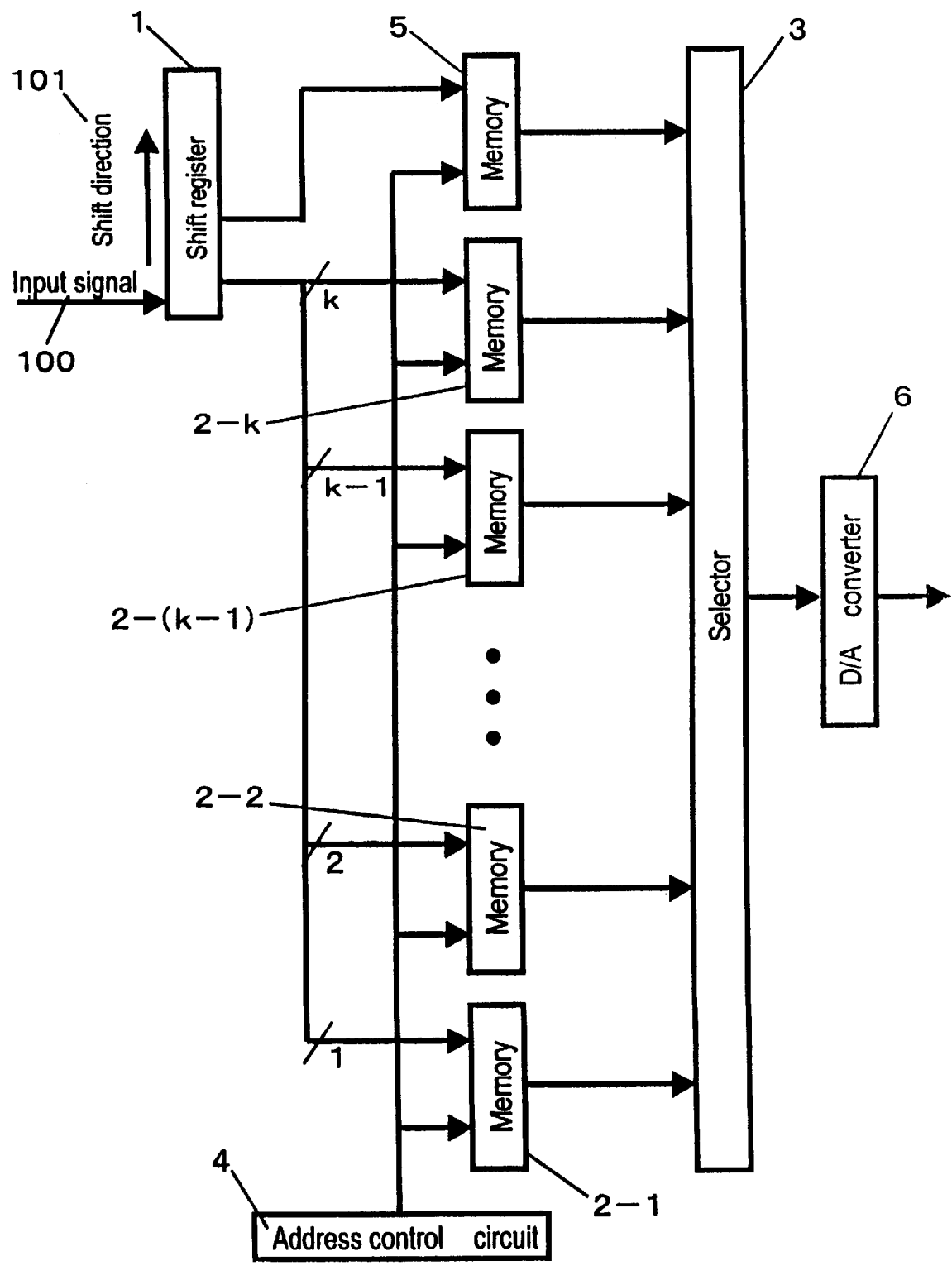
FIG. 1 is a block diagram of a filter device in a first embodiment of the invention.

FIG. 1 is a block diagram of a filter device in a first embodiment of the invention.

A digital serial signal 100 entered in the filter device is put into a shift register 1. When the beginning data of the input signal 100 after start of transmission is shifted to the first bit of the shift register 1, a selector 3 selects the output of a memory 2-1 of which higher side address width is /1. When the beginning data of the input signal 100 is shifted to the second bit of the shift register 1, the selector 3 selects the output of a memory 2-2 of which higher side address width is /2. In the same manner, the selector 3 sequentially changes the memory output to be selected from 2-1, 2-2, . . . , to 2-(k−1) and 2-k until the beginning data of the input signal 100 is shifted to the k-th bit of the shift register 1. In shifting after bit k+1 of the shift register 1, the selector 3 keeps to select the memory 5. FIG. 1 schematically shows the shift direction 101 of the shift register 1.

At the bit position of the shift register 1 corresponding to the higher address of the memories 2-1, 2-2, . . . , the impulse response corresponding to the data at each bit position is considered, and it is combined with the waveform interference given to the position of a specific bit of the shift register 1, and is digitized. The information to be stored in each memory is its digitized data, and it is converted into an analog signal by a D/A converter 6 of a later stage.

The higher side address width of the memory 5 is equal to the bit width (number of stages) of the shift register 1. Each impulse response waveform corresponding to the data at each bit position of the shift register 1 combined with the waveform interference given to the specific bit position is digitized. The information to be stored in the memory 5 is its digitized data, and it is converted into an analog signal waveform by the D/A converter 6 of a later stage.

The lower address of each memory (2-1, . . . , 2-k, 5) generated in an address control circuit 4 is for over-sampling the changes of analog output signal of the D/A converter 6 during input of next data in the shift register 1 at time t+1 from the state of the shift register 1 at a certain time t. When a next signal is put into the filter device, the time for shifting each bit of the shift register 1 to the adjacent bit is divided into 2k, and the data issued from the D/A converter 6 in this period is stored in each memory (2-1, . . . , 2-k, 5). Supposing the lower side address of each memory (2-1, . . . , 2-k, 5) to be j bits, the operating speed is 2j times of the speed of bit shift of the shift register 1.

Thus, until the beginning data is shifted to the k-th bit of the shift register 1, selection of output of the memories (2-1, . . . , 2-k) is changed over sequentially depending on the bit shift on the shift register 1 of the beginning data. It is therefore possible to control to increase gradually the degree of effect of the impulse response to the specific bit position. Accordingly, in this filter device, if the output signal of the modulator is suddenly changed over from stop state to transmission state, the output of the D/A converter 6 is not changed drastically, and no serious interference is caused on other channels remote in frequency, so that the performance as the modulator may be maintained.

(Embodiment 2)

Figure 2:
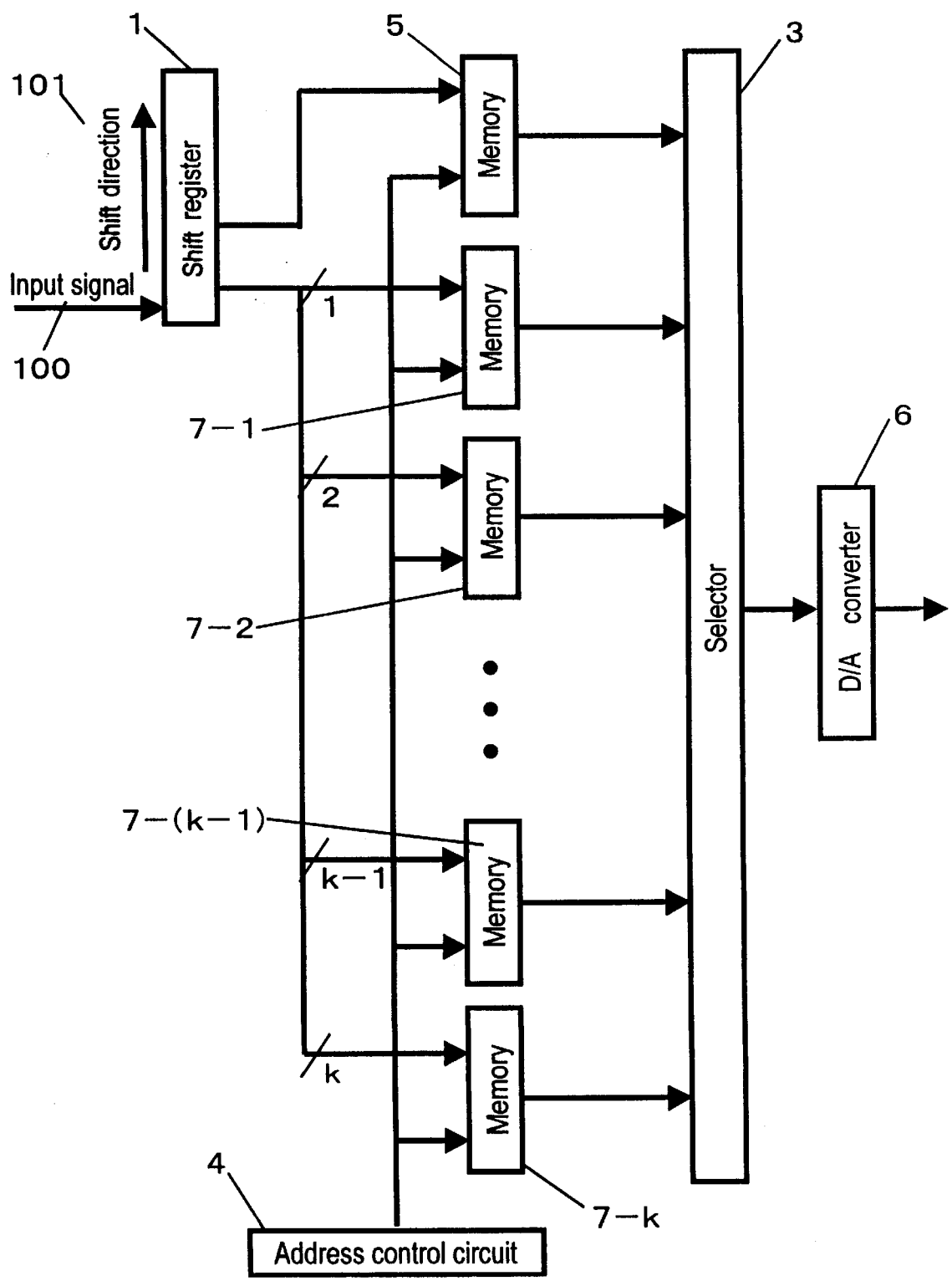
FIG. 2 is a block diagram of a filter device in a second embodiment of the invention.

FIG. 2 is a block diagram of a filter device in a second embodiment of the invention. In the explanation of the second embodiment, same reference numerals are given to the parts having the same functions as in FIG. 1.

A digital serial signal 100 entered in the filter device is put into a shift register 1. When transmission is stopped and final data is put into the shift register 1 to be shifted to the k-th bit from the end of the shift register 1, a selector 3 selects the output of a memory 7-k of which higher side address width is /k. When the final data is shifted to bit k−1 of the remaining stages of the shift register, the selector 3 selects the output of a memory 7-(k−1) of which higher side address width is /k−1. In the same manner, the selector 3 sequentially changes the memory output to be selected from 7-k, 7-(k−1), . . . , to 7-2 and 7-1 until the final data is shifted to the first bit from the end of the shift register. Until the final data leaves k stages of the shift register, the selector 3 keeps to select the memory 5.

At the bit position of the shift register 1 corresponding to the higher side address of the memories 7-k, . . . , 7-1, the impulse response corresponding to the data at each bit position is considered, and it is combined with the waveform interference given to the position of a specific bit of the shift register 1, and is digitized. The information to be stored in each memory is its digitized data, and it is converted into an analog signal by a D/A converter 6 of a later stage.

The higher side address width of the memory 5 is equal to the bit width (number of stages) of the shift register 1. Each impulse response waveform corresponding to the data at each bit position of the shift register 1 combined with the waveform interference given to the specific bit position is digitized. The information to be stored in the memory 5 is its digitized data, and it is converted into an analog signal waveform by the D/A converter 6 of a later stage.

The lower address of each memory (7-k, . . . , 7-1, 5) generated in an address control circuit 4 is for over-sampling the changes of analog output signal of the D/A converter 6 during input of next data in the shift register 1 at time t+1 from the state of the shift register 1 at a certain time t. When a next signal is put into the filter device, the time for shifting each bit of the shift register 1 to the adjacent bit is divided into 2k, and the data issued from the D/A converter 6 in this period is stored in each memory (7-k, . . . , 7-1, 5). Supposing the lower side address of each memory (7-k, . . . , 7-1, 5) to be j bits, the operating speed is 2j times of the speed of bit shift of the shift register 1.

Thus, until the final data is shifted to the k-th bit to the first bit from the end of the shift register 1, selection of output of the memories (7-k, . . . , 7-1) is changed over sequentially depending on the bit shift on the shift register 1 of the final data. It is therefore possible to control to decrease gradually the degree of effect of the impulse response to the specific bit position. Accordingly, in this filter device, if the output signal of the modulator is suddenly changed over from transmission state to stop state, the output of the D/A converter 6 is not changed drastically, and no serious interference is caused on other channels remote in frequency, so that the performance as the modulator may be maintained.

(Embodiment 3)

Figure 3:
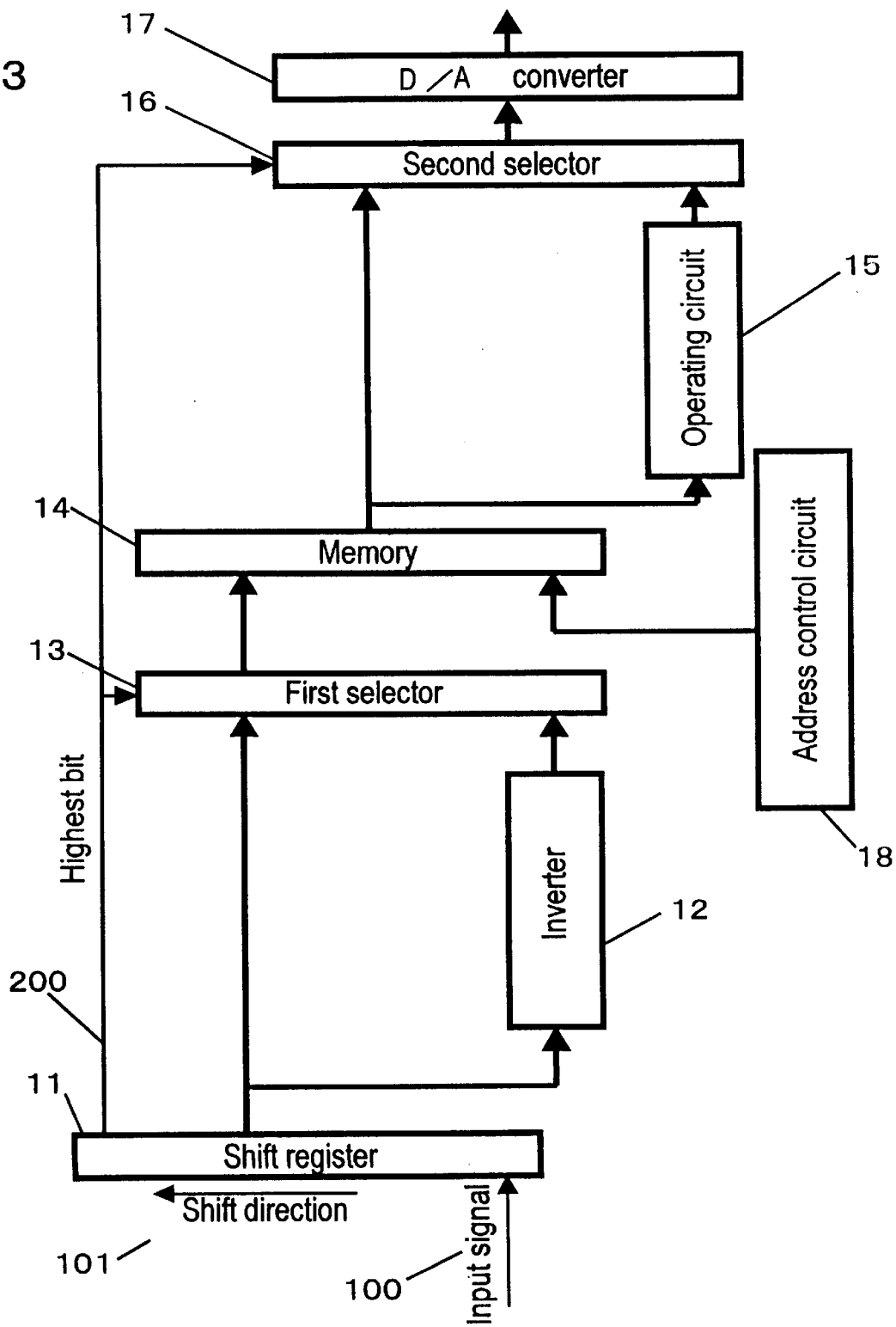
FIG. 3 is a block diagram of a filter device in a third embodiment of the invention.

FIG. 3 is a block diagram of a filter device in a third embodiment of the invention.

A digital serial signal 100 entered in the filter device is put into a shift register 11. An inverter 12 receives other bits than highest bit 200 of the shift register 11, and inverts 1 or 0 of each bit. A first selector 13 receives the output of the shift register 11 except for the highest bit 200 and the output of the inverter 12, and the highest bit 200 of the shift register 11 is used as the selection signal. The first selector 13 selects the output of the inverter 12 when the highest bit 200 is 1, and selects the output of the shift register 11 when the highest bit 200 is 0, and sends out to a memory 14 in a next stage. In the memory 14, the higher side of the address input is the output of first selector 13, and the lower side of the address input is the output of an address control circuit 18.

Fixing the value of the highest bit 200 of the shift register 11 at 0, each impulse response waveform corresponding to the data at each bit position of the shift register 11 other than the highest bit 200 combined with the waveform interference given to the specific bit position is digitized. The information to be stored in the memory 14 is its digitized data, and it is converted into an analog signal waveform by a D/A converter 17 of a later stage. The lower address of the memory 14 generated in the address control circuit 18 is for over-sampling changes of the analog output signal of the D/A converter 17 for a period of input of next data in the shift register 11 at time t+1, from the state of the shift register 11 at a certain time t. When a next signal is put into the filter device, the time for shifting each bit of the shift register 11 to the adjacent bit is divided into 2 (exponential) k, and the data issued from the D/A converter 17 in this period is stored in the memory 14. The lower side address of the memory 14 is k bits, and the operating speed is 2 (exponential) k times of the speed of bit shift of the shift register 11.

An operating circuit 15 executes the aliasing operation to the nearly central value of the dynamic range of the output of the D/A converter 17 defined by the data information of the memory 14 on the value read out from the memory 14. The operating circuit 15 executes the operation of 2Vc−Vrom, supposing the nearly central value to be Vc and the read-out value to be Vrom. For example, when the output of the memory 14 is Vrom (hex) in 10 bits, and the nearly central value Vc of the dynamic range to be 1FF (hex), the operating circuit 15 executes the operation of 3FE (hex)−Vrom (hex). A second selector 16 receives the output of the memory 14 and the output of the operating circuit 15, and, using the highest bit 200 of the shift register 11 as the selection signal, selects the output of the operating circuit 15 when the highest bit 200 is 1, or selects the output of the memory 14 when the highest bit 200 is 0, and sends out to the D/A converter 17 of a next stage.

Thus, by using the highest bit 200 of the shift register 11 as the selection signal and executing the aliasing operation in the operating circuit 15 on the value read out from the memory 14, if the capacity of the memory 14 is half that of using all bits of the shift register 11, the filter device prevents deterioration of performance such as precision of modulation, and assures the performance as the modulator.

(Embodiment 4)

Figure 4:
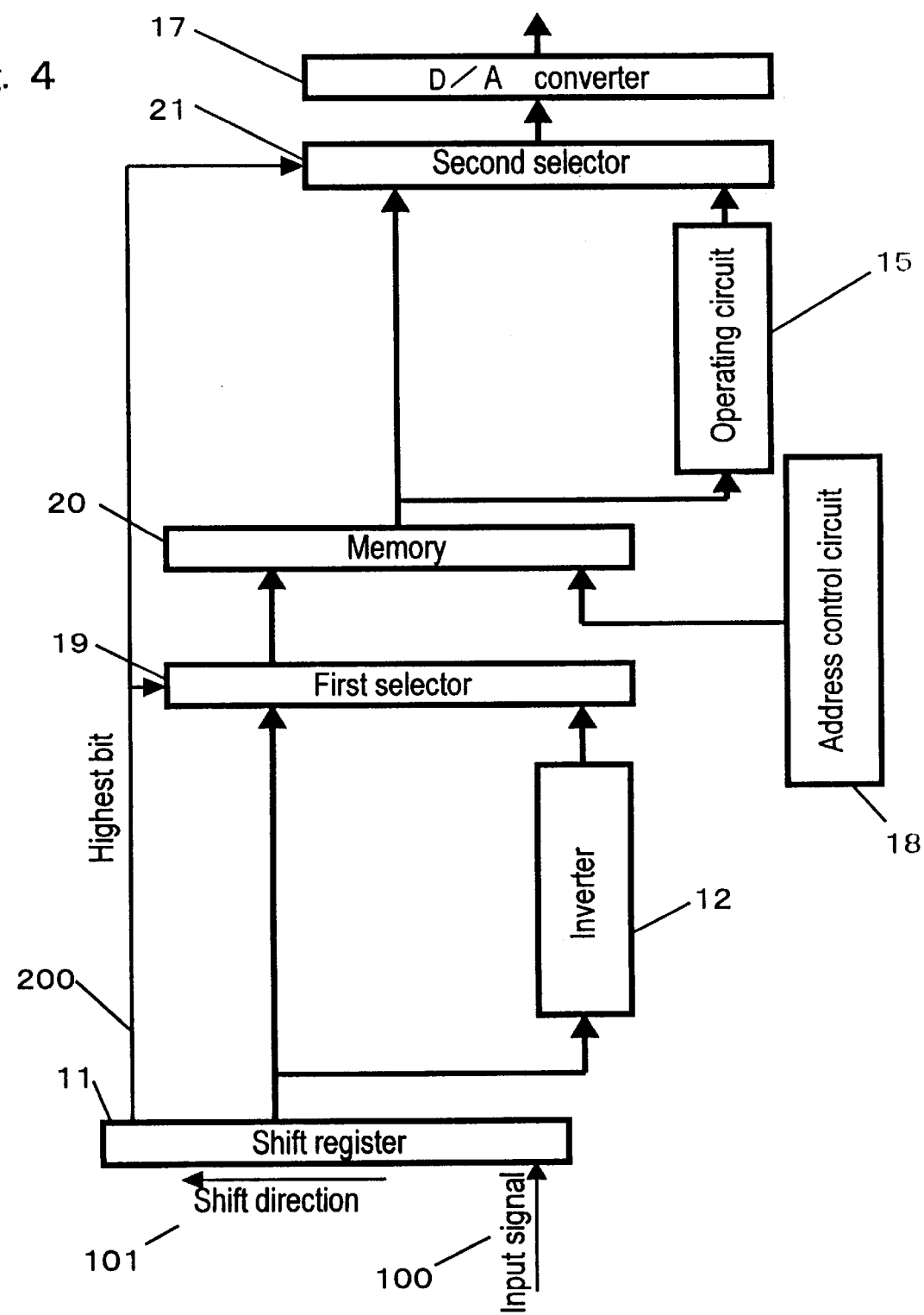
FIG. 4 is a block diagram of a filter device in a fourth embodiment of the invention.

FIG. 4 is a block diagram of a filter device in a fourth embodiment of the invention. In the explanation of the fourth embodiment, same reference numerals are given to the parts having the same functions as in FIG. 3.

A digital serial signal 100 entered in the filter device is put into a shift register 11. An inverter 12 receives other bits than highest bit 200 of the shift register 11, and inverts 1 or 0 of each bit. A first selector 19 receives the output of the shift register 11 except for the highest bit 200 and the output of the inverter 12, and, using the highest bit 200 of the shift register 11 as the selection signal, selects the output of the inverter 12 when the highest bit 200 is 0, and selects the output of the shift register 11 when the highest bit 200 is 1, and sends out to a memory 20 in a next stage. In the memory 20, the higher side of the address input is the output of first selector 19, and the lower side of the address input is the output of an address control circuit 18.

Fixing the value of the highest bit 200 of the shift register 11 at 1, each impulse response waveform corresponding to the data at each bit position of the shift register 11 other than the highest bit 200 combined with the waveform interference given to the specific bit position is digitized. The information to be stored in the memory 20 is its digitized data, and it is converted into an analog signal waveform by a D/A converter 17 of a later stage. The lower address of the memory 20 generated in the address control circuit 18 is for over-sampling changes of the analog output signal of the D/A converter 17 for a period of input of next data in the shift register 11 at time t+1, from the state of the shift register 11 at a certain time t. When a next signal is put into the filter device, the time for shifting each bit of the shift register 11 to the adjacent bit is divided into 2 (exponential) k, and the data issued from the D/A converter 17 in this period is stored in the memory 20. The lower side address of the memory 20 is k bits, and the operating speed is 2 (exponential) k times of the speed of bit shift of the shift register 11.

An operating circuit 15 executes the aliasing operation to the nearly central value of the dynamic range of the output of the D/A converter 17 defined by the data information of the memory 20 on the value read out from the memory 20, and hence executes the operation of 2Vc−Vrom, supposing the nearly central value to be Vc and the read-out value to be Vrom. For example, when the output of the memory 20 is Vrom (hex) in 10 bits, and the nearly central value Vc of the dynamic range to be 1FF (hex), the operating circuit 15 executes the operation of 3FE (hex)−Vrom (hex). A second selector 21 receives the output of the memory 20 and the output of the operating circuit 15, and, using the highest bit 200 of the shift register 11 as the selection signal, selects the output of the operating circuit 15 when the highest bit 200 is 0, or selects the output of the memory 20 when the highest bit 200 is 1, and sends out to the D/A converter 17 of a next stage.

Thus, by using the highest bit 200 of the shift register 11 as the selection signal and executing the aliasing operation in the operating circuit 15 on the value read out from the memory 20, if the capacity of the memory 20 is half that of using all bits of the shift register 11, the filter device prevents deterioration of performance such as precision of modulation, and assures the performance as the modulator.

(Embodiment 5)

Figure 5:
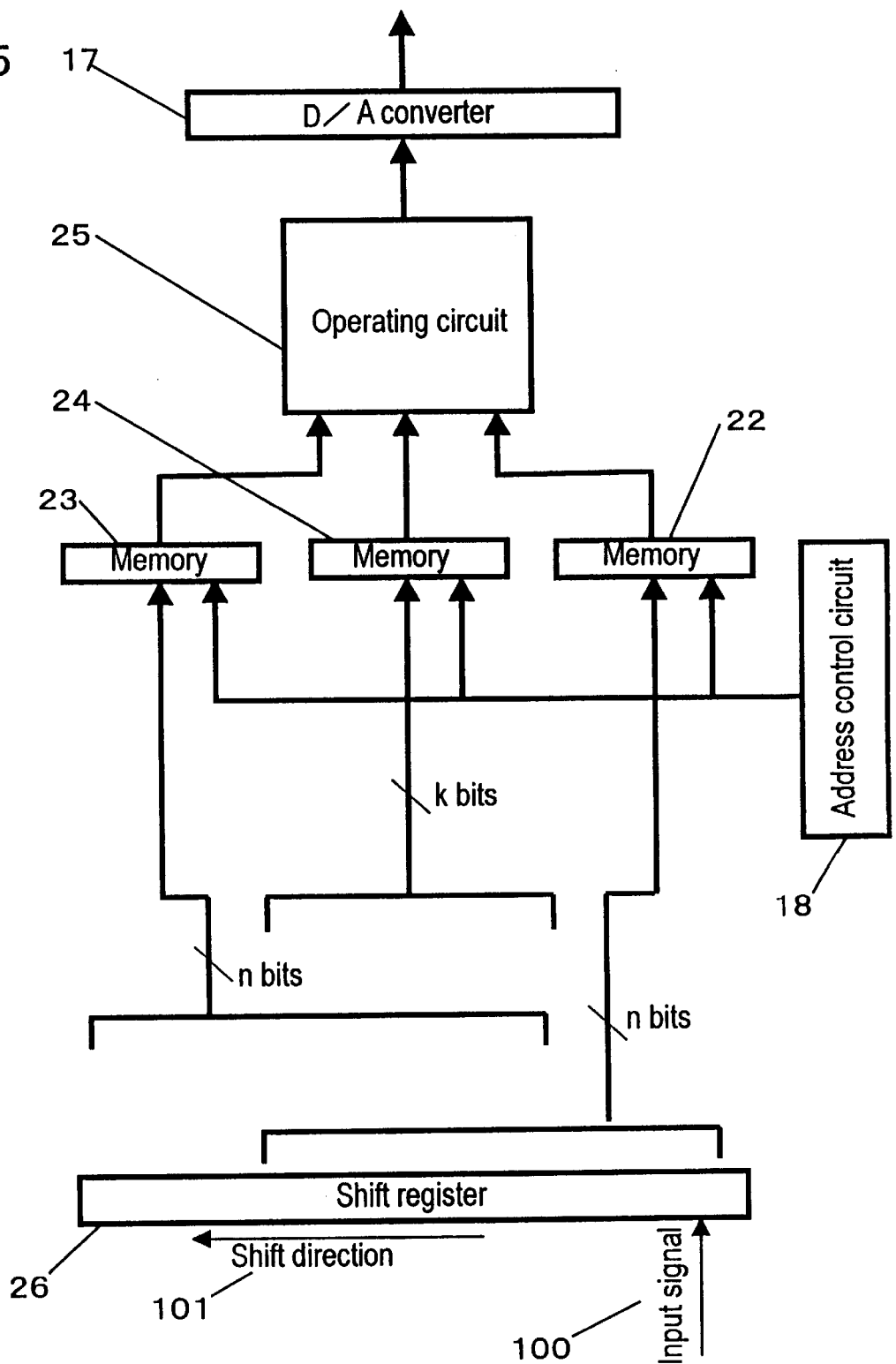
FIG. 5 is a block diagram of a filter device in a fifth embodiment of the invention.
Figure 6:
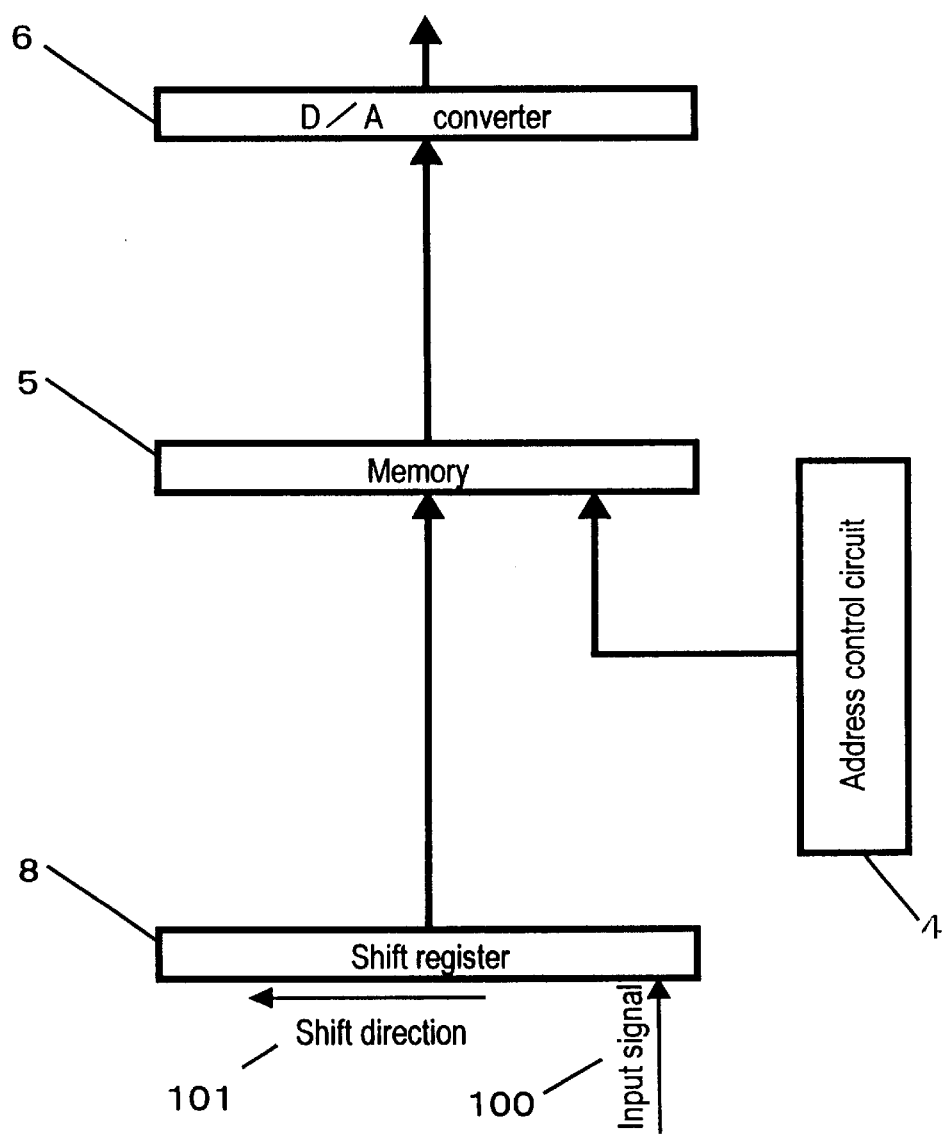
FIG. 6 is a block diagram of a filter device of a prior art.
Figure 7:
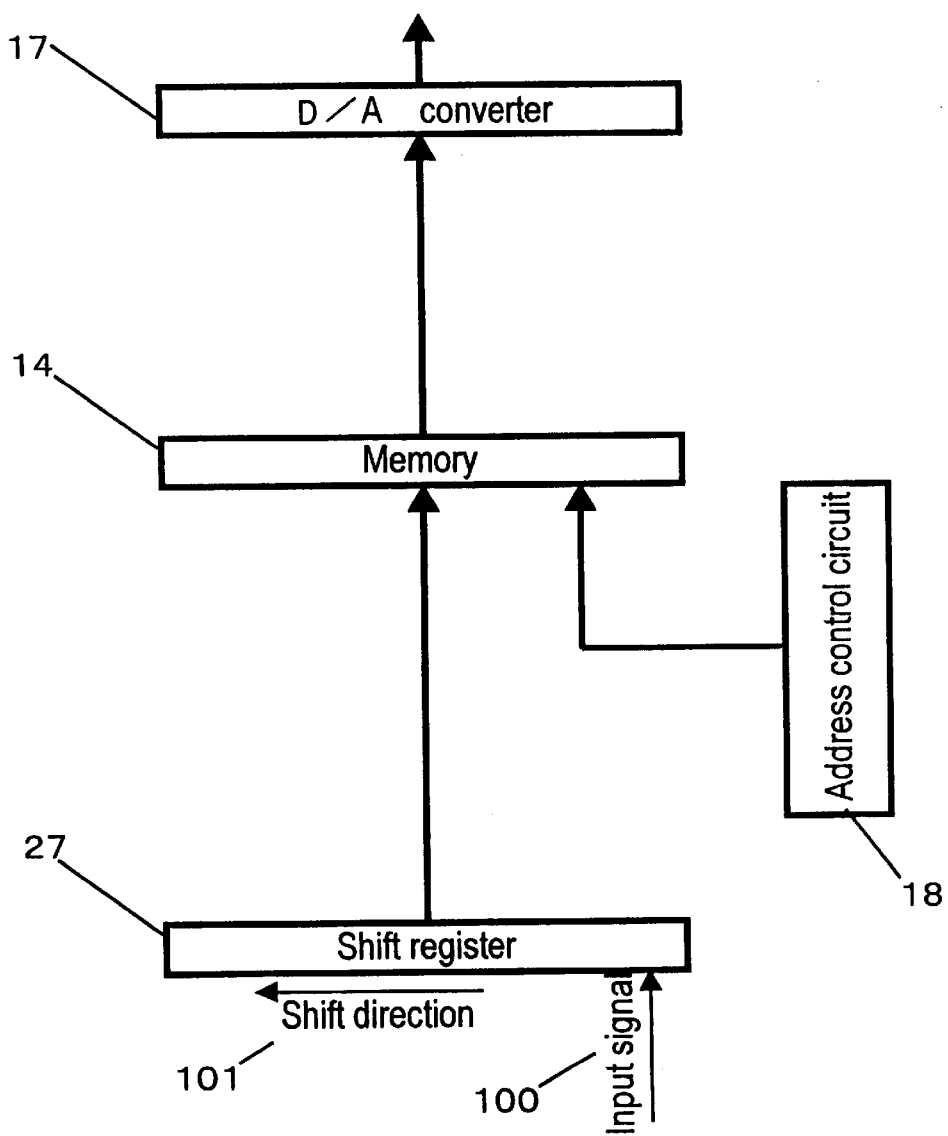
FIG. 7 is a block diagram of a filter device of other prior art.

FIG. 5 is a block diagram of a filter device in a fifth embodiment of the invention. In the explanation of the fifth embodiment, same reference numerals are given to the parts having the same functions as in FIG. 3.

A digital serial signal 100 entered in the filter device is put into a shift register 26 of 2n−k stages.

The higher side address of a first memory 22 receives the lower side n bits of the shift register 26, and issues the lower side of the address input to an address control circuit 18. The higher side address of a second memory 23 receives the higher side n bits of the shift register 26, and issues the lower side of the address input to the address control circuit 18. The higher side address of a third memory 24 receives k bits which are a common address of the memory 22 and memory 23, out of 2n−k bits of the shift register 26, and issues the lower side of the address input to the address control circuit 18.

Each impulse response waveform corresponding to the data at each bit position of n output bits of the shift register 26 used as the address of the memory 22 combined with the waveform interference given to the specific bit position in the k bits used as the address of the memory 24 is digitized. The information to be stored in the memory 22 is its digitized data, and it is operated in the operating circuit 25, and is converted into an analog signal waveform by a D/A converter 17. Each impulse response waveform corresponding to the data at each bit position of n output bits of the shift register 26 used as the address of the memory 23 combined with the waveform interference given to the specific bit position in the k bits used as the address of the memory 24 is digitized. The information to be stored in the memory 23 is its digitized data, and it is operated in the operating circuit 25, and is converted into an analog signal waveform by the D/A converter 17. Each impulse response waveform corresponding to the data at each bit position of k output bits of the shift register 26 used as the address of the memory 24 combined with the waveform interference given to the specific bit position is digitized. The information to be stored in the memory 24 is its digitized data, and it is operated in the operating circuit 25, and is converted into an analog signal waveform by the D/A converter 17.

The lower address of the memory 22, memory 23, and memory 24 generated in the address control circuit 18 is for over-sampling changes of the analog output signal of the D/A converter 17 for a period of input of next data in the shift register 26 at time t+1, from the state of the shift register 26 at a certain time t. When a next signal is put into the filter device, the time for shifting each bit of the shift register 26 to the adjacent bit is divided into 2 (exponential) k, and the data issued from the D/A converter 17 in this period is stored in the memory 24. The lower side address of the memory 24 is k bits, and the operating speed is 2 (exponential) k times of the speed of bit shift of the shift register 26.

An operating circuit 25 receives the memory 22, memory 23 and memory 24, and, supposing each value to be V12, V13, V14, operates (V12+V13)−V14, and issues the result to the D/A converter 17.

Thus, by dividing the memory, and operating the values read out from the memory 22, memory 23 and memory 24 in the operating circuit 25, if the capacity is {2(exponential)(n+1)+2(exponential)k}/{2(exponential)(2n−k)} as compared with the memory capacity by using all bits of the shift register 26, the filter device prevents deterioration of performance such as precision of modulation, and assures the performance as the modulator.

Industrial Applicability

Thus, according to the invention, by changing over the memory output depending on the beginning data position entered in the shift register, it is possible to control to increase gradually the degree of effect of impulse response of the data at each bit position. As a result, if the output signal of the modulator is suddenly changed from stop state to transmission state, the output of the filter device is not changed drastically, and no serious interference is caused on other channels remote in frequency, so that the performance as the modulator is maintained Also according to the invention, by using the highest bit of the shift register as the selection signal and operating the value being read out from the memory, if the memory capacity is half of using all bits of the shift register, the filter device prevents deterioration of performance such as precision of modulation, and assures the performance as the modulator.

What is claimed is:

1. A filter device comprising a shift register, a plurality of memories connected to this shift register and increased in the bit width of input address by one bit each, and a selector for selecting outputs from these plurality of memories, wherein said shift register output is used as a higher side address of each one of said memories, a lower side address of each one of said memory addresses is common, the bit width of the higher side address increases by one bit each starting from one bit, addresses are assigned sequentially from the lower side of the higher side address of said memories depending on the shift from the lowest side bit of said shift register, and the memory outputs are changed over by the selector depending on the bit position of the shift register of the beginning bit after start of transmission.

2. A filter device comprising a shift register, a plurality of memories connected to this shift register and increased in the bit width of input address by one bit each, and a selector for selecting outputs from these plurality of memories, wherein said shift register output is used as a higher side address of each one of said memories, a lower side address of each one of said memory addresses is common, the bit width of the higher side address increases by one bit each starting from one bit, addresses are assigned sequentially from the lower side of the higher side address of said memories depending on the shift from the highest side bit of said shift register, and the memory outputs are changed over by the selector depending on the bit position of the shift register of the final bit before stop of transmission.

3. A filter device comprising a shift register, an inverter for inverting the bits except for the highest bit of the output signal from this shift register from 1 to 0 or from 0 to 1, a first selector for selecting the bits except for the highest bit of this inverter output or said shift register output, a memory using the output of this first selector as the higher side input address, an operating circuit for operating this memory output, and a second selector for selecting and issuing either this operating circuit output or said memory output, wherein when the highest bit of said shift register is 1, the first selector selects said inverter output and the second selector selects said operating circuit output, and when the highest bit of said shift register is 0, the first selector selects said shift register output and the second selector selects said memory output.

4. A filter device comprising a shift register, an inverter for inverting the bits except for the highest bit of the output signal from this shift register from 1 to 0 or from 0 to 1, a first selector for selecting the bits except for the highest bit of this inverter output or said shift register output, a memory using the output of this first selector as the higher side input address, an operating circuit for operating this memory output, and a second selector for selecting and issuing either this operating circuit output or said memory output, wherein when the highest bit of said shift register is 0, the first selector selects said inverter output and the second selector selects said operating circuit output, and when the highest bit of said shift register is 1, the first selector selects said shift register output and the second selector selects said memory output.

5. A filter device comprising a first memory having n-bit address, a second memory having n-bit address, a third memory having k-bit address, a shift register of 2n−k bits connected to the input side of these first to third memories, and an operating circuit connected to the output side of said first to third memories, wherein said n and k satisfy formula 1,

[Formula 1]

$$2^x(2n-k) > 2^x(n+1) + 2^x(k)$$

where x denotes an index, the higher side address of said first memory is lower side n bits of said shift register, the higher side address of said second memory is higher side n bits of said shift register, and the higher side address of said third memory is a k-bit address where said first memory address and said second memory address out of 2n−k bits of said shift register are common.

* * * * *